United States Patent [19]

Heinle

[11] Patent Number: 4,470,000
[45] Date of Patent: Sep. 4, 1984

[54] APPARATUS AND METHOD FOR SIMULATING THE MACHINE FLUX OF A ROTATING FIELD MACHINE

[75] Inventor: Georg Heinle, Erlangen, Fed. Rep. of Germany

[73] Assignee: Siemens Aktiengesellschaft, Munich, Fed. Rep. of Germany

[21] Appl. No.: 421,303

[22] Filed: Sep. 22, 1982

[30] Foreign Application Priority Data

Sep. 28, 1981 [DE] Fed. Rep. of Germany ....... 3138557

[51] Int. Cl.³ .............................................. H02P 7/36
[52] U.S. Cl. ...................................... 318/805; 318/798
[58] Field of Search ............... 318/798, 803, 807, 806, 318/805, 799, 800–802, 809–811, 721–724

[56] References Cited

U.S. PATENT DOCUMENTS 3,593,083  7/1971  Blaschke ............................ 318/227
4,245,181  1/1981  Plunkett ............................. 318/805
4,335,343  6/1982  Dreiseitl et al. ..................... 318/798

FOREIGN PATENT DOCUMENTS 1418573  12/1975  United Kingdom .

OTHER PUBLICATIONS

Gabriel, R. et al., "Field Oriented Control of a Standard AC-Motor Using Microprocessors", IEEE Trans., IAS 79:29G, pp. 910–916.
Regelungstechnik, vol. 27, No. 12, Dec. 1979, pp. 379–386, by Gabriel et al.

Primary Examiner—J. V. Truhe
Assistant Examiner—Patrick Keane
Attorney, Agent, or Firm—Kenyon & Kenyon

[57] ABSTRACT

The machine flux of a rotating-field machine is determined from the digitized values of the machine stator terminal voltages and conductor currents averaged within a sampling period of an associated digital evaluation system. In order to form each component of the machine flux, the average value of a stator terminal voltage of the same phase, reduced by the ohmic voltage drop in that phase of the stator winding of the rotating-field machine, is multiplied by the clock period of the digital evaluation system and by a scaling factor and the average values so formed for each clock cycle are summed up. From the integral so obtained, the digitized value of the conductor current of the same phase averaged within a sampling period of an associated digital evaluation system and appropriately scaled, is substracted. The simulation of the machine flux can thereby be accomplished digitally. Because averaged values of the terminal voltages and conductor currents are used in the method, there are no sampling problems in digitizing the values.

7 Claims, 6 Drawing Figures

APPARATUS AND METHOD FOR SIMULATING THE MACHINE FLUX OF A ROTATING FIELD MACHINE

BACKGROUND OF THE INVENTION

1. Field of the Invention

The present invention relates to a method and circuit arrangement for simulating the machine flux of a rotating-field machine from the terminal voltages and conductor currents of at least two phases of the stator of the rotating-field machine and more particularly, to a method and circuit wherein each component of the machine flux is formed by integrating the stator terminal voltage of the same phase which is reduced by the ohmic voltage drop in that phase of the stator winding of the rotating-field machine, and the integrated inductive voltage drop is subtracted from the integral so obtained. The term "rotating-field machine" includes synchronous and asynchronous machines which can be operated as motors or generators.

2. Description of the Prior Art

A method of the kind above mentioned is known from U.S. Pat. No. 4,335,343 corresponding to German Auslegeschrift No. 2833593. The disclosure of U.S. Pat. No. 4,335,343 is hereby incorporated by reference. For regulating rotating-field machines, the actual value of the amplitude and phase of the magnetic machine flux is frequently required since the torque generated by the rotating-field machine, which is equal to the product of the machine flux and the current component perpendicular to the flux, can thereby be determined. The direct determination of the machine flux, for instance, by magnetic measuring pickups or by a measuring winding is not practical because such measurement pickups or windings are not provided in commercially available machines. According to U.S. Pat. No. 4,335,343, mentioned above, the machine flux is therefore determined by means of a computing circuit from the stator terminal voltages and conductor currents of two of the three phases of the rotating-field machine. This computing circuit is called the voltage model of the rotating-field machine. The determination of a system for simulating the machine flux begins with the fact that the voltage $u_i$ induced in each machine leg is proportional to the change of the flux and to the number of turns w in that leg:

$$u_i = w(d\phi/dt)$$

The flux can then be calculated by integrating the voltage induced in that leg of the rotating-field machine. The terminal voltage of the machine includes, however, besides the induced voltage $u_i$, also the ohmic and inductive voltage drops due to the copper resistance and the leakage inductance of the stator. Corrections to account for these voltage drops are made by simulating them electronically and subtracting them from the terminal voltage. Such computing circuits are realized at present exclusively by analog means. In conjunction with digital computers, however, a digital realization of the computing circuit would be advantageous because signal exchange is simplified by digital representations and the calculation of the flux can be performed by the digital computer itself, thereby saving separate analog components.

So far, digital realizations of the voltage model have failed due to the difficulties in the analog to digital (A/D) conversion of the terminal voltages. The excessively large errors that occur during sampling and A/D conversion of the terminal voltages at low machine speeds prevent simple conversion techniques. This is caused on the one hand by the fact that at low machine speeds, the terminal voltages become very small, so that the steps of the A/D converter lead to large sampling errors. Furthermore, the terminal voltages contain steep commutation peaks which are very large compared to the basic component of the terminal voltages, especially at low speeds. These commutations peaks, however, occur at random, and may or may not be present during any particular sampling instant of the A/D converter. In the subsequent integration, too large an amount is integrated if the sampling instant coincided with a commutation peak, or too low an amount if the commutation peak was not present. The integrators contained in the computing circuit integrate every error in the A/D conversion, so that incorrect values are produced very rapidly. It is therefore an object of the present invention to develop a method for simulating the machine flux of a rotating-field machine in such a manner that it can be carried out by digital means without sampling error.

SUMMARY OF THE INVENTION

According to the present invention, this problem is solved by the provision that the digitized values of the stator terminal voltages and conductor currents are averaged within the sampling period of a corresponding digital evaluation system, and that the integration is carried out by adding up the averaged values and by multiplication with the sampling period.

According to the method of the invention, because the digitized averages instead of the instantaneous values of the terminal voltages and conductor currents which have inherent errors for the reasons above mentioned are used, the problem of integrating errors in the digital sampling is eliminated. This occurs because the forming of averages already includes the integration of the measured values, thereby in a sense displacing integration ahead of the analog to digital conversion. The problem of sampling the commutation peaks as well as the difficulty of processing small terminal voltages is thus eliminated. In order to integrate the digitized values, the averages merely need to be summed up.

The summing can be realized in a simple manner with a digital cumulative summation stage which sums the present average value with the cumulative sum of the averages at prior sampling times. Such a stage therefore includes a means for storing the cumulative sum for a time equal to the sampling period of the digital evaluation system. At the input to the summation stage are the sum of the output voltage of the summation stage via a feedback loop and the respective digitized average of the terminal voltage reduced by the ohmic voltage drop of the rotating-field machine.

The digital summation stage preferably includes a digital memory, the setting input of which is addressed by a transfer clock signal delayed relative to the main clock of the digital evaluation system. The summation stage can thereby be realized in a simple manner by a commercially available digital memory such as a shift register composed of D type flip-flops.

In order to form averaged digitized values of the terminal voltages and conductor currents, the latter can be fed via an integrating A/D converter to a first digital memory, the output of which is connected to the first input of a digital subtraction stage and also to the input of the second digital memory. The output of the second digital memory is connected to the second input of the digital subtraction stage. The output of the digital subtraction stage is connected to the input of a third digital memory, at the output of which a digitized signal proportional to the desired average value is present. Within each clock period of the digital evaluation system, first, the first memory, then the third memory and finally, the second memory receives a setting pulse. The formation of the averages of the terminal voltages and conductor currents can thereby be carried out with simple commercially available components.

According to the invention, the integrating A/D converter preferably comprises a voltage to frequency converter followed by a pulse counter. The voltage to frequency converter can be advantageously preceded by a summer, have at its first input the analog quantity to be converted and at its second input, a shifting voltage which is larger than the maximum negative value for the terminal voltage and which is chosen so that it causes within a sampling period of the digital evaluation system a full count-down of the following counter. The counter capacity of the counter is thereby counted through exactly once due to the shifting voltage. By this provision, the voltage to frequency converter need only process positive quantities.

These and other novel features and advantages of the invention will described in greater detail in the following detailed description.

DETAILED DESCRIPTION

The mathematical foundation for the method will first be explained. As already shown in the aforementioned U.S. Pat. No. 4,335,343, every component of the magnetic flux in the rotor is obtained by subtracting the ohmic voltage drop from the corresponding component of the stator terminal voltage, by integrating the difference and then subtracting from this value the integrated inductive voltage drop. This relation is indicated by the following equations:

$$\phi_R = b_2 \int_o^t (U_R - i_R R_1)dt - b_1 i_R \quad (1)$$

$$\phi_S = b_2 \int_o^t (U_S - i_S R_1)dt - b_1 i_S \quad (2)$$

where $\phi_{R,S}$ is the component of the rotor flux in the direction of the phase R or S of the stator of the rotating-field machine in the 120° three phase R, S, T rotating-field system; $i_{R,S}$ is the component of the stator current in the respective phase R or S of the stator; and $R_1$ is the primary copper resistance.

$b_1$ and $b_2$ are chosen as abbreviations for the following quantities which can be derived from the machine equation of the rotating-field machine:

$$b_1 = l\sigma_1 + l\sigma_2 + \frac{l\sigma_1}{3/4\, l} \quad (3)$$

$$b_2 = \frac{3/2\, l + l\sigma_2}{3/2\, l} \quad (4)$$

where $l\sigma_2$ is the primary leakage inductance; $l\sigma_2$ is the secondary leakage inductance; and $l$ is the main inductance.

Figure 1:
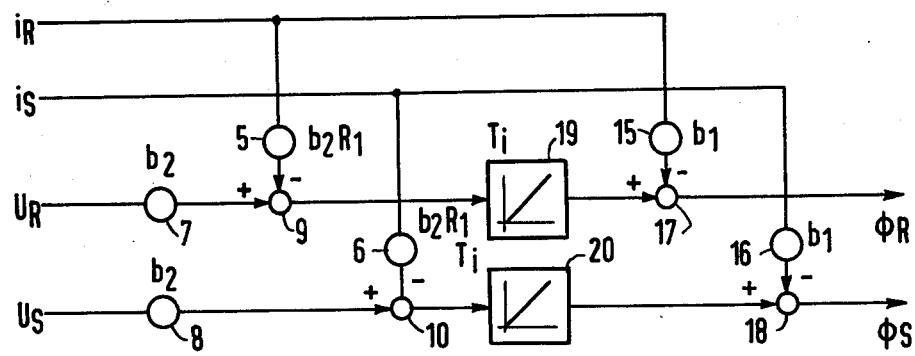
FIG. 1 is a block diagram of a known analog system for simulating the flux components.

Formulas 1 to 4 are the basis for the conventional analog voltage model, such as is known, for instance, from the aforementioned U.S. Pat. No. 4,335,343. FIG. 1 shows a block diagram of this known analog voltage model. The terminal voltage $U_R$ and $U_S$ of the R and S phases of the machine stator are fed via coefficient multipliers 7 and 8 to inputs of analog subtraction stages 9 and 10 respectively. The currents $i_R$ and $i_S$ in the the phases R and S of the stator are fed via coefficient multipliers 5 and 6 to the respective second inputs of the subtraction stages 9 and 10. According to equations 1 and 2, the coefficient multipliers 7 and 8 multiply by the factor $b_2$ and the coefficient multipliers 5 and 6 by the factors $b_2R_1$. The quantities $b_2U_R-b_2R_1i_R$ and $b_2U_S-b_2R_1i_S$ are therefore formed by the subtraction stages 9 and 10, respectively. The output signals of the subtraction stages 9 and 10 are fed to integrators 19 and 20, respectively, which integrate the mentioned differences according to equations 1 and 2. The respective outputs of the integrators 19 and 20 are each connected to the inputs of respective second analog subtraction stages 17 and 18. The currents $i_R$ and $i_S$ are coupled via coefficient multipliers 15 and 16 to the second inputs of the subtraction stages 17 and 18. The coefficient multipliers 15 and 16 are each set to the value $b_1$, so that the values $i_Rb_1$ and $i_Sb_1$ are subtracted from the respective integrals according to equations 1 and 2. Equations 1 and 2 are thus converted into an analog computing circuit. As already explained, however, the method according to the block diagram of FIG. 1 is not suitable for digital realization because the terminal voltages $U_R$ and $U_S$ would carry large errors after the required A/D conversion, which would be integrated by the integrators 19 and 20. For this reason, a method for simulating the machine flux is needed which works with already integrated values. According to the invention, in order to accomplish this objective, the integrals in equations 1 and 2 are first replaced by the sum of the averages.

$$\phi_R = -i_R \cdot b_1 + \quad (5)$$

$$\sum_{v'=o}^{n} \left[ b_2 \int_{v' \cdot T}^{(v'+1)T} U_R dt - b_2 R_1 \int_{v' \cdot T}^{(v'+1)T} i_R dt \right]$$

$$\phi_S = -i_S \cdot b_1 + \quad (6)$$

$$\sum_{v'=o}^{n} \left[ b_2 \int_{v' \cdot T}^{(v'+1)T} U_S dt - b_2 R_1 \int_{v' \cdot T}^{(v'+1)T} i_S dt \right]$$

Here, $v'$ is the running number of the sampling period T.

Equations 5 and 6 still mathematically describe the exact voltage model. The instantaneous values $i_R$ and $i_S$ can be replaced according to the invention, by the values of $i_R$ and $i_S$ averaged over a clock period of an associated digital evaluation system. Since the clock periods are generally very short, the error caused thereby is small. For abbreviation, the average values of the leg currents $i_R$ and $i_S$ and the terminal voltages $U_R$ and $U_S$ respectively, are designated by a bar:

$$\phi_R \approx -b_1 \bar{i}_R(v') + b_2 T \sum_{v'=o}^{n} [\bar{U}_R(v') - R_1 \bar{i}_R(v')] \quad (7)$$

$$\phi_S \approx -b_1 \bar{i}_S(v') + b_2 T \sum_{v'=o}^{n} [\bar{U}_S(v') - R_1 \bar{i}_S(v')] \quad (8)$$

Figure 2:
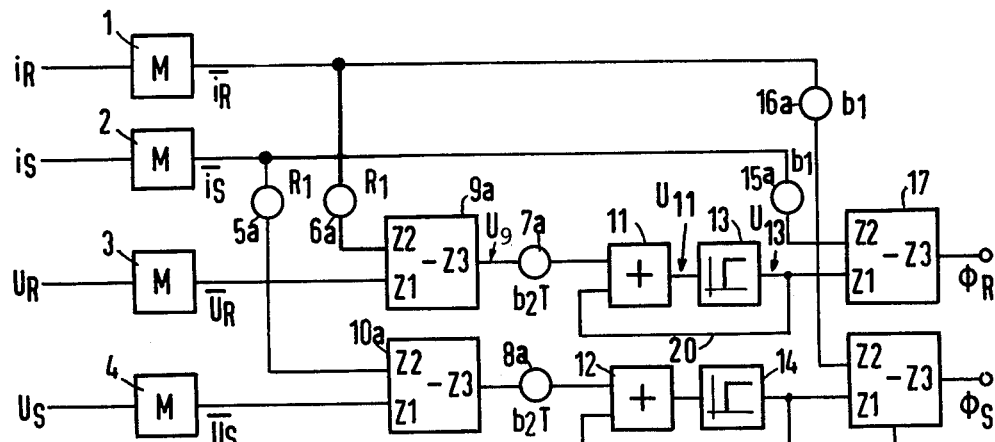
FIG. 2 is a block diagram of the system according to the invention for simulating the flux components.

FIG. 2 shows a block diagram by which equations 7 and 8 are realized. The conductor currents $i_R$ and $i_S$ as well as the terminal voltages $U_R$ and $U_S$ are fed to respective mean value formers 1 to 4, yet to be explained in detail, which each form therefrom the digitized averages $\bar{i}_R$ and $\bar{i}_S$ and $\bar{U}_R$ and $\bar{U}_S$. The digitized average currents $\bar{i}_R$ and $\bar{i}_S$ are fed via coefficient multipliers 5a and 6a to the inputs Z2 of subtraction stages 9a and 10a, respectively, which contrary to the subtraction stages 9 and 10 in the analog block diagram, operate digitally. The digitized averages of the terminal voltages $U_R$ and $U_S$, respectively, are fed directly to the inputs Z1 of the subtraction stages 9a and 10a in the illustrated embodiment. The integrators 19 and 20 in the analog voltage model of FIG. 1 are replaced by the summing circuits comprising summer 11 and cumulative storage stage 13, and the summer 12 and cumulative storage stage 14, respectively. Cumulative storage stages 13 and 14 provide means for storing the cumulative value of the averages for the previous clock period during the present clock period, and might comprise, for example, shift registers comprising D type flip-flops which transfer into memory the data present at the output of summer 11 or 12 once the sum has been computed. The multiplication required according to equations 7 and 8 by the factor $b_2 T$ is accomplished with coefficient multipliers 7a and 8a respectively connected between the subtraction circuits 9a and 10a and the summers 11 and 12. Since the coefficient multipliers 7a and 8a already contain the factor $b_2$, the coefficient multipliers 5a and 6a are set to the factor $R_1$, contrary to the analog voltage model of FIG. 1. The digital coefficient multipliers 15a and 16a and the digital subtraction circuits 17a and 18a again correspond to the analog coefficient multipliers 15 and 16 and the subtraction circuits 17 and 18.

Figure 3:
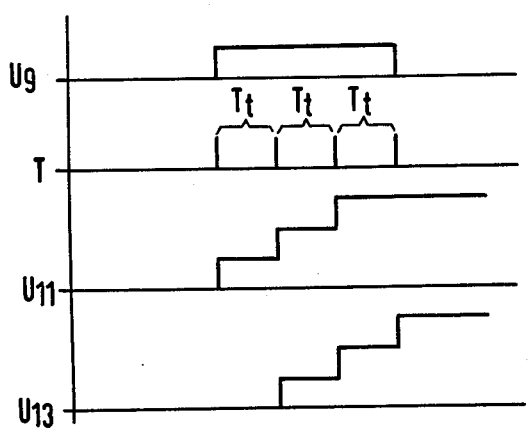
FIG. 3 is a timing diagram of certain of the signals present in FIG. 2.

In the following, the operation of the cumulative summation circuits comprising summers 11 and 12 and cumulative storage stages 13 and 14 are explained with the aid of the timing diagram of FIG. 3. It is the purpose of these circuits, as already explained, to sum up the differences, present at the outputs of the subtraction circuits 9 and 10, between the scaled conductor currents $i_R$ and $i_S$ and the terminal voltages $U_R$ and $U_S$, averaged over one clock period. In FIG. 3, the signal designated $U_9$ is present at the output of the subtraction stage 9 of FIG. 2. It is assumed that the output signal of cumulative storage stage 13, designated $U_{13}$, is initially 0. The output signal of the summer, 11, designated $U_{11}$, therefore agrees at first with the signal $U_9$. After one clock period $T_t$ of the associated digital evaluation system, the input signal to the storage stage 13 is transferred to the output and is returned via feedback loop 20 to the input of summer 11 which forms the new signal $U_{11}$. Thus, the signal $U_9$ present during the second clock period is added, after the end of the time $T_t$, to the signal $U_9$ present during the first clock period. After a further time $T_t$, the new cumulative sum $U_{11}$ again appears at the output of the storage stage 13 and is fed back again to the summer 11. Thus, there occurs in the third clock period a further summation of the signal $U_9$ with the value of the signal $U_{13}$ present at the output of the storage stage 13. When the signal $U_9$ goes back to zero, the output signal of the storage stage 13 retains its value. It has therefore been shown that the circuits comprising the summing circuits 11 and 12 and the storage stages 13 and 14 perform the desired summation of the digitized values, averaged within a sampling period, of the terminal voltages $U_R$ and $U_S$ and the conductor currents $i_R$ and $i_S$.

Figure 4:
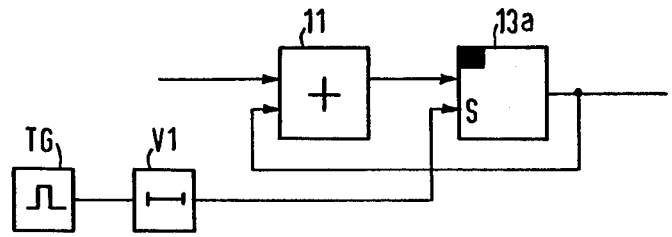
FIG. 4 is a more detailed block diagram of the summing stages of FIG. 2.

The storage stages 13 and 14 can be realized, as shown in FIG. 4, for instance, with a digital memory 13a, the setting input S of which is addressed by a clock generator TG of an associated digital evaluation system via a delay stage V1. After each pulse of the clock generator TG occurs, the signal which is present for a short time at the input of the memory 13 is transferred into the memory 13. A delay of the transfer relative to the clock signal of the clock generator TG is necessary so that the formation of the averages of the input signals taking place in the same clock period is completed by the time the transfer command occurs.

Figure 5:
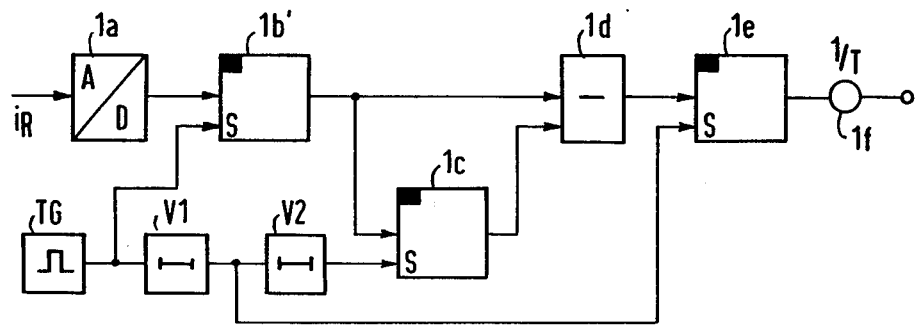
FIG. 5 is a more detailed block diagram of the average forming stages of FIG. 2.

FIG. 5 illustrates a realization of each of the average formers 1 to 4. In FIG. 5, an input signal, for instance, the leg current $i_R$, is fed to the analog input of the integrating A/D converter 1a. The integrated digitized value of the input signal $i_R$ is therefore present at the digital output of the A/D converter 1a. In order to form therefrom values of the input signal $i_R$ averaged over a clock period, the respective difference of the integrals of the input signal $i_R$ for two successive clock pulses must be formed. For this purpose, the digital output of the integrating A/D converter 1a, is coupled to the memory inputs of memory 1b. For each clock pulse of the clock generator TG which is connected to the setting input of the memory 1b, the signal present is transferred into the memory 1b. The output of memory 1b is connected to the input of the memory 1c as well as to one input of the subtraction circuit 1d. The clock generator TG is coupled to the setting input of the memory 1c via two series connected delay stages having delay times V1 and V2. Because the memory 1c stores the contents of the memory 1b only at the end of the delay time V1+V2, it still contains the old input value when a clock pulse occurs, while the memory 1b stores the new input value. At the output of the subtraction stage 1d is therefore present the difference between the input value in the present clock period and the input value in the preceding clock period. The output of the subtraction circuited is connected to the input of a further memory 1e, the setting input of which is connected to the output of the delay stage V1. The memory 1e thereby stores the desired difference of the integrated values at the end of the delay time V1. The delay stage V1 is necessary to ensure setting the memory 1b for the new input value before the difference is stored in the memory 1e. After the desired difference is stored in the memory 1e, the memory 1c is set to a new value at the end of the delay time of the delay stage V2. The output signal of memory 1e is then scaled by the factor 1/T by coefficient multiplier 1f to form the average. The desired digitized value of the input signal, averaged over one clock period, is thus present at the output.

Integrating A/D converters in the form of integrated circuits are commercially available, however, which output a value of the input voltage averaged over a sampling period. An integrated circuit can therefore be used for every average former 1 to 4.

Figure 6:
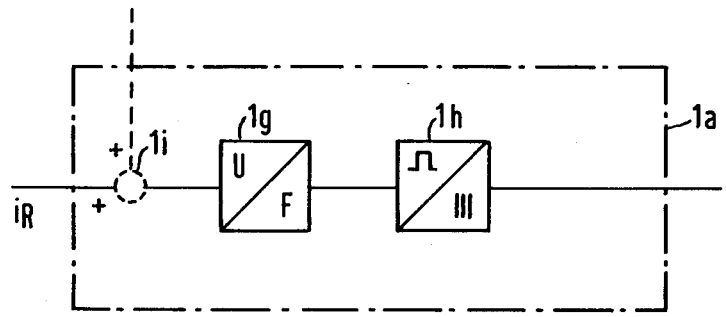
FIG. 6 is a block diagram of the A/D converter of FIG. 5 which may be employed to practice the invention.

FIG. 6 shows an example of the integrating A/D converter 1a of FIG. 5. The signal to be converted, for instance, the conductor current $i_R$, is fed to the input of a voltage to frequency converter 1g, which is followed by a pulse counter 1h. The counter 1h sums up the pulses of the voltage to frequency converter 1g, i.e., the digital integral of the input variable $i_R$ is formed. This type of integrating A/D converter also assures that the commutation peaks are included in the formation of the integral. In addition, the voltage to frequency converter 1g does not have incremental steps like a conventional A/D converter, which could have an adverse effect on the accuracy of the conversion in the case of small input values.

The voltage to frequency converter 1g must be able to process positive as well as negative input values. A voltage to frequency converter capable of processing only positive values is sufficient, however, if the input variable is coupled via a summer 1i, as shown in FIG. 6. At the second input of the latter a signal is present which is larger in magnitude than the largest negative value of the input signal. Therefore, a positive signal is always present at the voltage input of the voltage to frequency converter 1g. The value present at the second input of the summer 1i is furthermore chosen so that it causes the counter 1h to count down exactly one time within a sampling period of the digital evaluation system, i.e., the counter runs through its counter capacity exactly one time. Thus, the signal added to the input signal causes no change of the counter contents in the absence of an input signal because the counter counts down exactly through its full counter capacity.

The method according to the invention can also be realized according to the block diagram of FIG. 2 in part by software. The only hardware that is required are integrating A/D converters, for instance, as shown in FIG. 6. The method described can thereby be used to particular advantage for computer controlled regulating systems, the hardware expense being reduced to a minimum.

In the foregoing specification, the invention has been described with reference to a specific exemplary embodiment thereof. It will, however, be evident that various modifications and changes may be made thereunto without departure from the broader spirit and scope of the invention as set forth in the appended claims. The specification and drawings are, accordingly, to be regarded in an illustrative rather than in a restrictive sense.

What is claimed is:

1. A circuit for simulating the machine flux of a rotating-field machine from the terminal voltage and conductor current of at least two phases of the stator of the rotating-field machine, and which is utilized in association with a digital evaluation system including means for generating a main clock signal having a period defining successive sampling periods, comprising:

first digital averaging means having the terminal voltage for at least said two phases as inputs for forming a digital average value of the terminal voltage for each of said two phases, said digital average value of the terminal voltage for respective ones of said two phases being formed in each of the successive sampling periods defined by said main clock signal;

second digital averaging means having the conductor current for at least said two phases as inputs for forming a digital average value of the conductor current for each of said two phases, said digital average value of the conductor current for respective ones of said two phases being formed in each of the successive sampling periods defined by said main clock signal;

means, for each of said two phases, having the digital average value of the conductor current for a respective one of said two phases as an input, for generating a digital signal proportional to an ohmic voltage drop in the stator of the rotating-field machine for respective ones of said two phases;

first digital subtraction means, for each of said two phases, having said digital average value of the terminal voltage and the digital signal proportional to the ohmic voltage drop for a respective one of said two phases as inputs, for producing a first digital difference signal proportional to a difference between said digital average value of the terminal voltage and the digital signal proportional to the ohmic voltage drop for respective ones of said two phases;

digital integrating means, for each of said two phases, having said first digital difference signal for a respective one of said two phases as an input, for integrating said first digital difference signal and producing an integrated digital signal for respective ones of said two phases;

means, for each of said two phases, having said digital average value of the conductor current for a respective one of said two phases as an input, for generating a digital signal proportional to an inductive voltage drop in the stator of the rotating-field machine for respective ones of said two phases; and second digital subtraction means, for each of said two phases, having said integrated digital signal and said digital signal proportional to the inductive voltage drop for a respective one of said two phases as inputs, for producing a second digital difference signal proportional to a difference between said integrated digital signal and said digital signal proportional to the inductive voltage drop for respective ones of said two phases, said second digital difference signal for respective ones of said two phases being proportional to the machine flux for respective ones of said two phases.

2. The circuit recited in claim 1 wherein said digital integrating means comprises:

digital summing means having first and second inputs and an output, said first digital difference signal being supplied to said first input; and digital storage means having an input and an output, the input of said digital storage means being coupled to the output of said digital summing means, the output of said digital storage means being coupled to said second input of said digital summing means, whereby said digital storage means accumulates a sum of said first digital difference signals for successive sampling periods.

3. The circuit recited in claim 2 wherein said digital evaluation system further comprises means for generating a transfer clock signal delayed with respect to said main clock signal, and wherein said digital storage means comprises digital memory means having a setting input, said transfer clock signal supplied to said setting input for causing the output of said digital summing means to be stored in said digital memory means.

4. The circuit recited in claim 1 wherein said first and second digital averaging means for forming a digital average value each comprise:
   integrating analog to digital converter means having a signal proportional to a terminal voltage or conductor current as an input, for producing a digital output signal;
   first digital memory means having said digital output signal as an input for storing said digital output signal at a first time, said first digital memory means further having an output on which said digital output signal stored in said first signal memory means is present;
   second digital memory means having an input coupled to the output of said first digital memory means, for storing said digital output signal stored in said first digital memory means at a second time after said first time, said second digital memory means further having an output on which said digital output signal stored in said second digital memory means is present;
   third digital subtraction means having a first input coupled to the output of said first digital memory means and a second input coupled to the output of said second digital memory means, for producing an output proportional to a difference between said output of said first digital memory means and said output of said second digital memory means; and
   third digital memory means having an input coupled to the output of said third digital subtraction means for storing the output of said third digital subtraction means at a third time, said third time being after said first time but before said second time, said third digital memory means further having an output, said output being proportional to said digital average value.

5. The circuit recited in claim 4 wherein said integrating analog to digital converter means comprises:
   voltage to frequency converter means having a signal proportional to a terminal voltage or conductor current as an input and an output comprising a train of pulses having a frequency proportional to the input of said voltage to frequency converter means; and
   pulse counter means coupled to the output of said voltage to frequency converter means having an output digital signal proportional to the input of said voltage to frequency converter means.

6. The circuit recited in claim 5, wherein said terminal voltage or conductor current has a maximum negative value and said integrating analog to digital converter means further comprises summing means having a first signal proportional to a terminal voltage or conductor current as a first input and a second signal greater in magnitude than said maximum negative value as a second input, said second signal selected so that said pulse counter means will count through full capacity in a sampling period when said second signal is present at said second input and said first signal is absent, said summing means further having an output coupled to the input of said voltage to frequency converter means.

7. A method for simulating the machine flux of a rotating-field machine from the terminal voltage and conductor current of at least two phases of the stator of the rotating-field machine, and which is utilized in association with a digital evaluation system including means for generating a main clock signal having a period defining successive sampling periods, comprising the steps of:
   obtaining a digital average value of the terminal voltage and a digital average value of the conductor current for each of the two phases, said digital average values being formed in each of the successive sampling periods defined by the main clock signal;
   generating, for each of the two phases, a digital signal proportional to an ohmic voltage drop in the stator of the rotating-field machine from the digital average value of the conductor current for respective ones of the two phases;
   producing, for each of the two phases, a first digital difference signal proportional to a difference between the digital average value of the terminal voltage and the ohmic voltage drop for respective ones of the two phases;
   integrating said first digital difference signal for each of the two phases to produce an integrated digital signal for respective ones of the two phases, said step of integrating comprising the step of cumulatively summing said first digital difference signals for each successive sampling period;
   generating, for each of the two phases, a digital signal proportional to an inductive voltage drop in the stator of the rotating-field machine from the digital average value of the conductor current for respective ones of the two phases; and
   producing, for each of the two phases, a second digital difference signal proportional to a difference between the integrated digital signal and the inductive voltage drop for respective ones of the two phases, said second digital difference signal for respective ones of the two phases being proportional to the machine flux for respective ones of the two phases.

* * * * *